United States Patent
Hematy et al.

(10) Patent No.: US 11,316,510 B1
(45) Date of Patent: Apr. 26, 2022

(54) TRANSISTORS DRIVERS WITH FAST SHUTDOWN-CAPABILITY, AND ASSOCIATED SYSTEMS AND METHODS

(71) Applicant: Maxim Integrated Products, Inc., San Jose, CA (US)

(72) Inventors: Arman Hematy, San Jose, CA (US); Carmelo Morello, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 484 days.

(21) Appl. No.: 16/277,451

(22) Filed: Feb. 15, 2019

Related U.S. Application Data

(60) Provisional application No. 62/710,664, filed on Feb. 16, 2018.

(51) Int. Cl.
  *H02H 7/00* (2006.01)
  *H03K 17/082* (2006.01)
  *H02H 9/02* (2006.01)
  *H03K 17/687* (2006.01)

(52) U.S. Cl.
  CPC ........... *H03K 17/0822* (2013.01); *H02H 9/02* (2013.01); *H03K 17/0826* (2013.01); *H03K 17/687* (2013.01)

(58) Field of Classification Search
  None
  See application file for complete search history.

(56) References Cited

U.S. PATENT DOCUMENTS

| | | | |
|---|---|---|---|
| 4,184,197 A * | 1/1980 | Cuk | H02M 3/005 363/16 |
| 4,363,064 A | 12/1982 | Billings et al. | |
| 5,815,380 A * | 9/1998 | Cuk | H02M 3/33569 363/131 |
| 7,339,773 B2 | 3/2008 | Gergintschew | |
| 7,369,386 B2 | 5/2008 | Rasmussen et al. | |
| 9,768,763 B2 | 9/2017 | Terasawa et al. | |
| 2018/0269701 A1* | 9/2018 | Dai | H02M 3/33523 |

\* cited by examiner

*Primary Examiner* — Stephen W Jackson
(74) *Attorney, Agent, or Firm* — Lathrop GPM LLP

(57) ABSTRACT

A method for quickly shutting down a transistor in a switching circuit includes (a) generating a feedback signal associated with current flowing through the transistor, (b) transmitting the feedback signal through an isolating device to a controller, (c) detecting an over-current condition in the switching circuit without transmitting information through the isolating device, and (d) shutting-down the transistor in response to detecting the over-current condition, without transmitting information through the isolating device. A transistor driver includes logic circuitry, an isolating device, driver circuitry configured to drive a transistor according to a control signal received from the logic circuitry via the isolating device, and over-current circuitry configured to (a) detect an over-current condition without receiving information via the isolating device and (b) cause the driver circuitry to shut-down the transistor in response to detection of the over-current condition, without receiving information via the isolating device.

20 Claims, 11 Drawing Sheets

US 11,316,510 B1

TRANSISTORS DRIVERS WITH FAST SHUTDOWN-CAPABILITY, AND ASSOCIATED SYSTEMS AND METHODS

RELATED APPLICATIONS

This Application claims benefit of priority to U.S. Provisional Patent Application Ser. No. 62/710,664, filed on Feb. 16, 2018, which is incorporated herein by reference.

BACKGROUND

A transistor driver is used to electrically interface a transistor's control terminal with other circuitry. For example, transistor drivers are commonly used to interface metal oxide semiconductor field effect transistor (MOSFET) gate terminals, as well as bipolar junction transistor (BJT) base terminals, with control circuitry. Some transistor drivers also provide galvanic isolation, such as to isolate low-voltage control circuitry from high-voltage at a transistor.

FIG. 1 illustrates a switching circuit 100 including a conventional transistor driver 102, a power transistor 104, a current sense resistor 106, an analog-to-digital converter (ADC) 108, an isolating device 110, and a controller 112. A galvanic isolation boundary 114 separates a low-voltage side 116 of switching circuit 100 from a high-voltage side 118 of switching circuit 100. In this document, the term "galvanic isolation boundary" refers to a structure of one or more elements which prevents direct-current (DC) flow between two portions of a circuit, such as between low-voltage and high-voltage sides of a circuit. Examples of elements which can form a galvanic isolation boundary include, but are not limited to, a dielectric printed circuit board surface, an optocoupler, a capacitive isolating device, and a transformer.

Controller 112 includes a control signal generator 120 and a filter 122. Control signal generator 120 generates a control signal 124, such as a pulse width modulated (PWM) signal or a pulse frequency modulated (PFM) signal, for controlling transistor 104. Transistor driver 102 includes logic circuitry 126, a capacitive isolating device 128, and transistor driver circuitry 130. Logic circuitry 126 is disposed on low-voltage side 116 of galvanic isolation boundary 114, and transistor driver circuitry 130 is disposed on high-voltage side 118 of galvanic isolation boundary 114. Capacitive isolating device 128 communicatively couples signals across galvanic isolation boundary 114 within transistor driver 102. Logic circuitry 126 receives control signal 124 and transmits control signal 124 to transistor driver circuitry 130 via capacitive isolating device 128, and driver circuitry 130 drives a gate G of transistor 104 according to control signal 124.

Current sense resistor 106 is electrically coupled to transistor 104 such that current I flowing through transistor 104 also flows through current sense resistor 106. Consequently, a voltage $V_r$ across current sense resistor 106 is proportional to magnitude of current I flowing through transistor 104. ADC 108 digitizes voltage $V_r$ to generate a feedback signal 132 representing magnitude of current I. Isolating device 110 communicatively couples feedback signal 132 across galvanic isolation boundary 114 to controller 112, where filter 122 of the controller filters feedback signal 132 to generate a filtered feedback signal 134. Logic circuitry 126 of transistor driver 102 monitors filtered feedback signal 134 and causes transistor driver circuitry 130 to shut-down transistor 104 if magnitude of current I exceeds a threshold value representing an over-current condition.

DETAILED DESCRIPTION OF THE EMBODIMENTS

Figure 1:
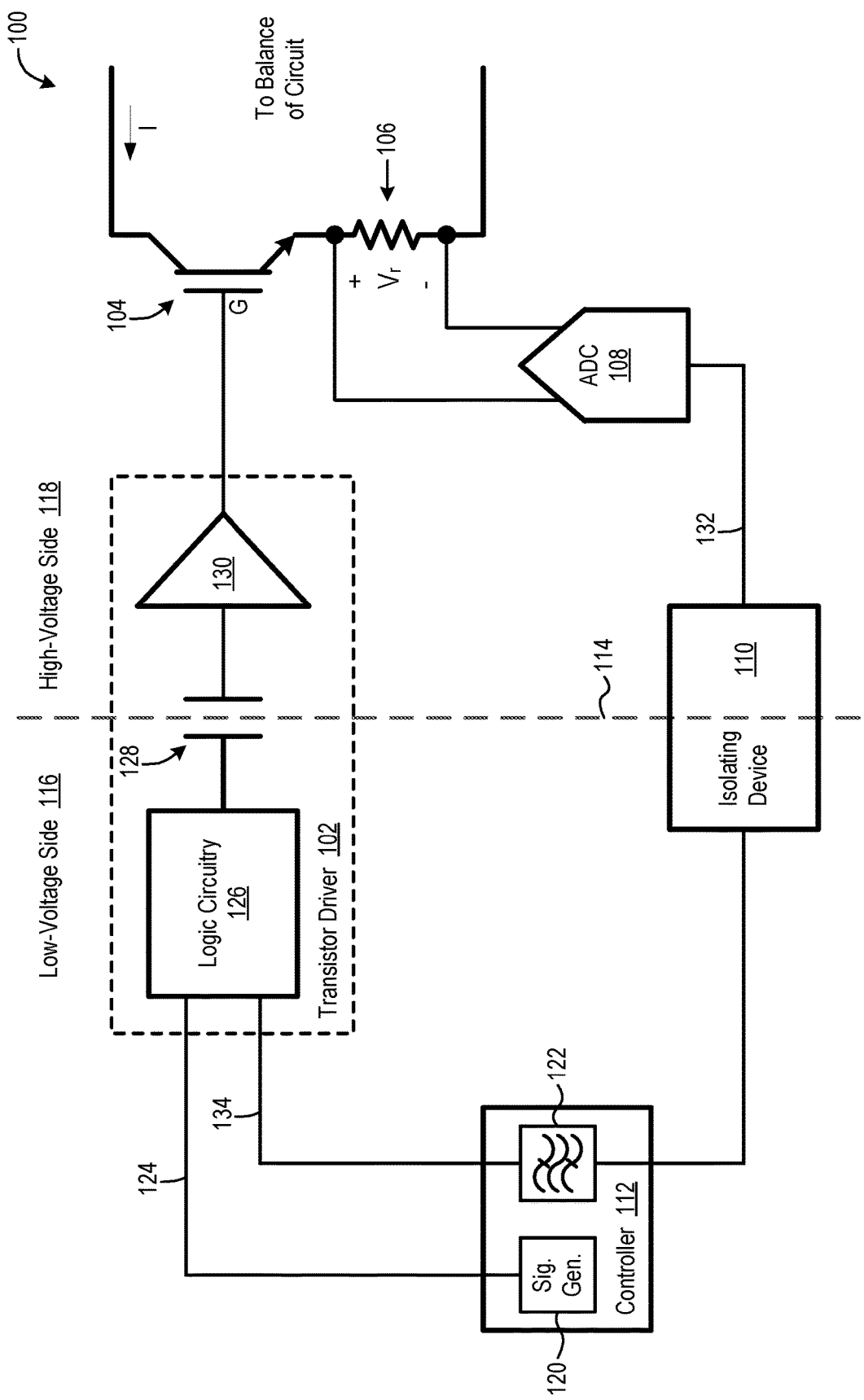
FIG. 1 illustrates a prior art switching circuit including a transistor driver.

Switching circuit 100 is capable of protecting transistor 104 from over-current damage in cases where transistor 104 can tolerate an over-current condition for a microsecond of more, such as in cases where transistor 104 is an insulated-gate bipolar junction transistor (IGBT), as illustrated. However, Applicant has found that switching circuit 100 may be incapable of protecting transistor 104 from an over-current condition in cases where transistor 104 cannot tolerate a sustained overcurrent condition, such as when transistor 104 is a Silicon Carbide (SiC) or a Gallium Nitride (GaN) transistor.

For example, consider a scenario where an over-current condition occurs, e.g., where magnitude of current I suddenly increases beyond a maximum rated current of transistor 104, such as due to a short circuit in a balance of circuit connected to transistor 104. There will be a significant delay from occurrence of the over-current condition to when transistor driver 102 shuts-down transistor 104. In particular, switching circuit 100 experiences the following delays when shutting-down transistor 104 in response to an over-current condition: (a) a delay associated with generation of feedback signal 132 by ADC 108, (b) a delay associated with transmission of feedback signal 132 by isolating device 110, (c) a delay associated with filtering of feedback signal by filter 122, (d) a delay associated with detection of the over-current condition by logic circuitry 126, (e) a delay associated with logic circuitry 126 signaling driver circuitry 130 to shut-down transistor 130, and (f) a delay associated with driver circuitry 130 shutting-down transistor 104. Such delays collectively amount to a total delay of approximately 300 nanoseconds. Although IGBTs commonly can tolerate an over-current condition for approximately one microsecond, SiC transistors typically can tolerate an over-current condition for only several hundred nanoseconds, and GaN transistors generally can tolerate an over-current condition for only tens of nanoseconds. Consequently, switching circuit 100 is incapable of shutting-down a SiC or GaN transistor sufficiently fast to ensure that transistor 104 is not damaged by an over-current condition.

Accordingly, Applicant has developed transistor drivers with fast shut-down capability, along with associated systems and methods. The new transistor drivers are configured to detect an over-current condition and cause a transistor to shut-down in response thereto without transmitting information across a galvanic isolation boundary, thereby significantly reducing transistor shut-down time compared to conventional transistor drivers.

Figure 2:
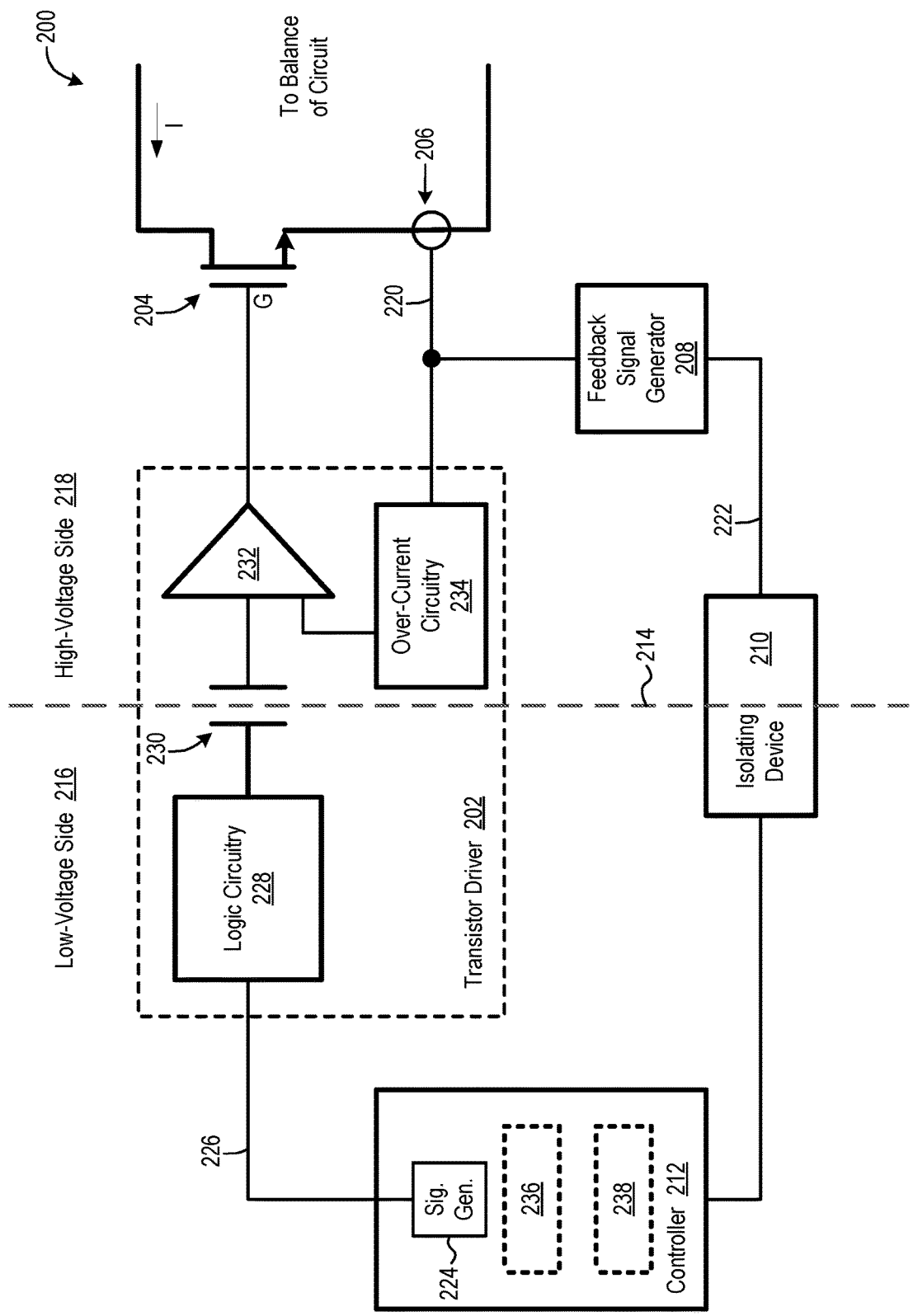
FIG. 2 illustrates a switching circuit including a transistor driver with fast shut-down capability.

FIG. 2 illustrates a switching circuit 200 including one embodiment of the new transistor drivers developed by Applicant. In particular, switching circuit 200 includes a transistor driver 202 with fast shut-down capability, a power transistor 204, a current sense device 206, a feedback signal generator 208, an isolating device 210, and a controller 212. A galvanic isolation boundary 214 separates switching circuit 200 into a low-voltage side 216 and a high-voltage side 218. Power transistor 204, current sense device 206, and feedback signal generator 208 are each disposed on high-voltage side 218 of galvanic isolation boundary 214, and controller 212 is disposed on low-voltage side 216 of galvanic isolation bounder 214. Transistor driver 202 and isolating device 210 each straddle galvanic isolation boundary 214.

Power transistor 204 is electrically coupled to current sense device 206 and to a balance of circuit. The balance of circuit represents additional circuit elements (not shown) which are electrically coupled to switching circuit 200. The configuration of the balance of circuit will vary depending on the application of switching circuit 200. For example, the balance of circuit may include a DC electrical power source, a load, one or more additional transistors, additional control circuitry, and/or filtering components.

Current sense device 206 generates a current signal 220 representing magnitude of current I flowing through power transistor 204. In some embodiments, such as discussed below with respect to FIG. 3, current sense device 206 includes one or more replica transistors configured such that current through the replica transistors is proportional to magnitude of current through power transistor 204. In some other embodiments, current sense device 206 includes a current sense resistor configured to generate a voltage proportional to magnitude of current I, such as discussed below with respect to FIG. 4. In yet some other embodiments, current sense device 206 includes of a Hall-Effect sensor configured to generate a signal in response to a magnetic field created by current I flowing through a conductor. Current sense device 206 could have other configurations without departing from the scope hereof.

Feedback signal generator 208 generates a feedback signal 222 representing current I. For example, in some embodiments, feedback signal 222 represents magnitude of current I. In some other embodiments, feedback signal 222 represents occurrence of an over-current condition, e.g., excessive magnitude of current I. Although feedback signal generator 208 is configured to generate feedback signal 222 based on current signal 220 in the illustrated embodiment, in some other embodiments, feedback signal generator 208 is configured to generate feedback signal 222 from a different signal, such as from a signal generated by a current sense device (not shown) in addition to current sense device 206. In particular embodiments, feedback signal generator 208 is configured to generate feedback signal 222 in digital form. Isolating device 210 is configured to transmit feedback signal 222 across galvanic isolation boundary 214 to controller 212. In certain embodiments, isolating device 210 includes a capacitive isolating device, an optocoupler, and/or a transformer, although isolating device 210 could take other forms without departing from the scope hereof.

Controller 212 includes a signal generator 224. Signal generator 224 generates a control signal 226 for controlling switching of transistor 204. In some embodiments, signal generator 224 generates control signal 226 at least partially based on feedback signal 222. In certain embodiments, signal generator 224 is configured so that control signal 226 is a PWM signal or a PFM signal. Controller 212 can include additional elements without departing from the scope hereof. For example, some embodiments of switching circuit 200 configured for motor drive applications further include a motor controller 236, and some embodiments of switching circuit 200 configured for inverter applications further include an inverter controller 238.

Transistor driver 202 includes logic circuitry 228, an isolating device 230, driver circuitry 232, and over-current circuitry 234. Logic circuitry 228 is communicatively coupled to controller 212 and interfaces transistor driver 202 with controller 212 by receiving at least control signal 226 from controller 212. Isolating device 230 transmits control signal 226 across galvanic isolation boundary 214 from logic circuitry 228 to driver circuitry 232. Although isolating device 230 is depicted as a capacitive isolating device, isolating device 230 could take other forms without departing from the scope hereof. Driver circuitry 232 drives a gate G of power transistor 204 according to control signal 226, to cause power transistor 204 to switch between its on and off states according to control signal 226. For example, in some embodiments, driver circuitry 232 drives gate G between at least two different voltage magnitudes according to control signal 226 to cause power transistor 204 to switch between its on and off states according to control signal 226.

Logic circuitry 228 optionally has additional functionality. For example, in some embodiments, logic circuitry 228 is further configured to have under-voltage lockout capability, e.g. where logic circuitry 228 is configured to control driver circuitry 232 to cause power transistor 204 to shut-down in response to power supply voltage to transistor driver 202 dropping below a threshold value. Transistor driver 202 can include additional elements without departing from the scope hereof.

Over-current circuitry 234 enables transistor driver 202 to achieve fast shut-down capability. In particular, over-current circuitry 234 is configured to monitor current signal 220 to detect an over-current condition. For example, in some embodiments, over-current circuitry 234 is configured to detect occurrence of the over-current condition in response to magnitude of current I exceeding a threshold value. Over-current circuitry 234 is further configured to cause driver circuitry 232 to shut-down power transistor 204, e.g., to cause power transistor 204 to operate in its off state, in response to detection of the over-current condition. Importantly, over-current circuitry 234 is configured to detect the over-current condition and to cause transistor driver 232 to shut-down power transistor 204 in response thereto without transmitting information across galvanic isolation boundary 214, e.g., without transmitting information through isolating device 210 and without transmitting information through isolating device 230. Consequently, transistor driver 202 is capable of shutting-down power transistor 204 without incurring the majority of the delays discussed above with respect to switching circuit 100 of FIG. 1. For example, in some embodiments, transistor driver 202 is capable of shutting down power transistor 204 within approximately 10 nanoseconds of occurrence of an over-current event, thereby enabling transistor driver 202 to protect power transistor 204 from an over-current event, even in embodiments where power transistor 204 is a SiC or GaN transistor.

In particular embodiments, controller 212 is further configured to detect occurrence of the over-current condition from feedback signal 222. In these embodiments, controller 212 is optionally configured to take one or more actions, e.g., notify an operator and/or shut-down a system including switching circuit 200, in response to the over-current condition. Controller 212 will typically not be capable of detecting the over-current condition as quickly as over-current circuitry 234, due to delays associated with generating feedback signal 222 and transmitting feedback signal 222 across galvanic isolation boundary 214. However, switching circuit 200 does not rely on controller 212 to protect power transistor 204 from an over-current event; instead, over-current circuitry 234 of transistor driver 202 protects power transistor 204 from the over-current event, as discussed above. Therefore, delay in detection of an over-current condition by controller 212 may be acceptable.

Figure 3:
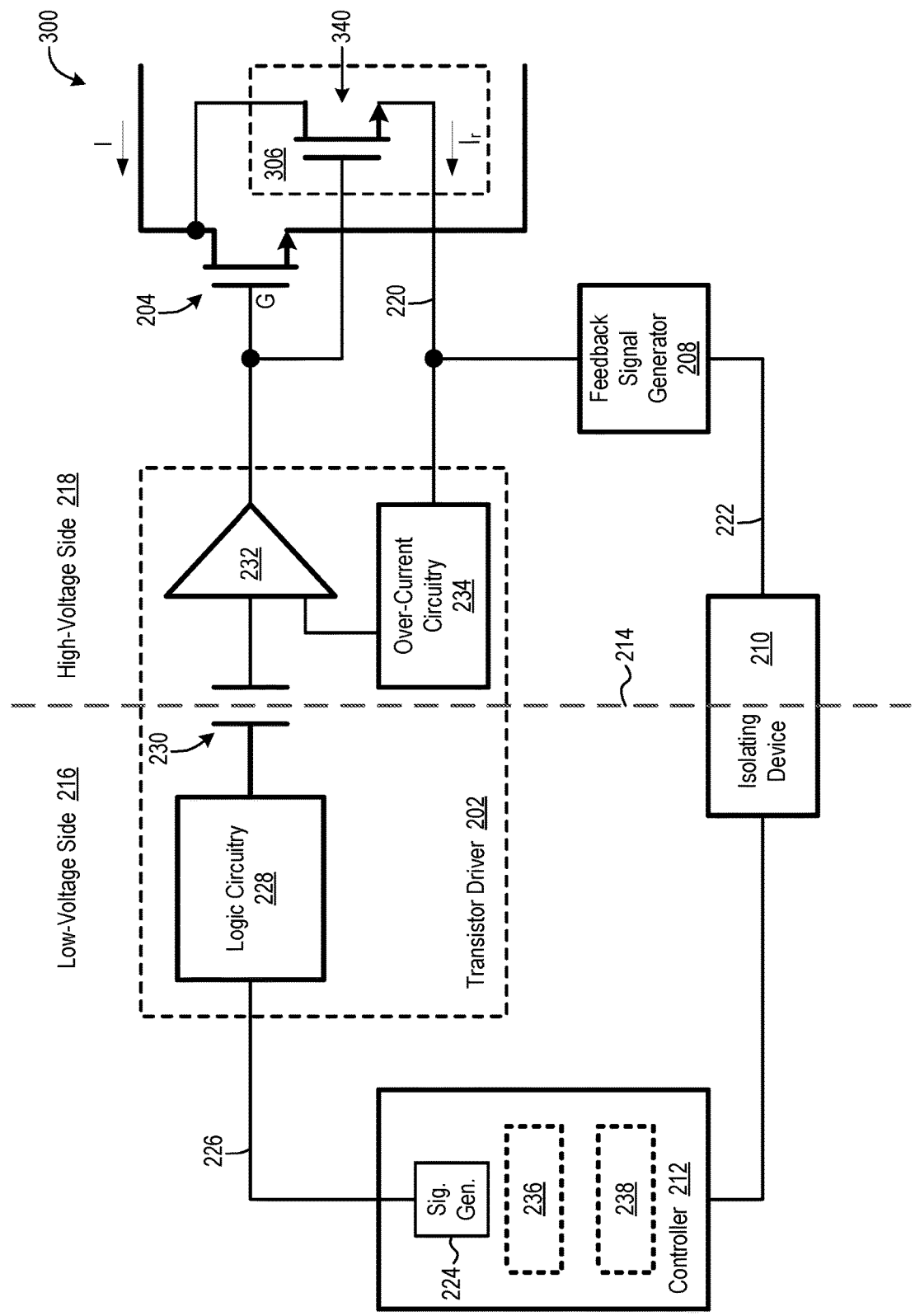
FIG. 3 illustrates an embodiment of the FIG. 2 switching circuit where a current sense device includes a replica transistor.

FIG. 3 illustrates a switching circuit 300, which is an embodiment of switching circuit 200 where current sense device 206 is embodied as a current sense device 306. Current sense device 306 includes a replica transistor 340 electrically coupled to power transistor 240. Replica transistor 340 has an on-resistance that is known multiple of an on-resistance of power transistor 204. Accordingly, magnitude of current $I_r$ flowing through replica transistor 340 is proportional to current I flowing through power transistor 204, and current signal 220 is derived from current $I_r$. In certain embodiments, current sense device 306 further includes bias circuitry (not shown) configured to control an operating point of replica transistor 340 so that magnitude of current $I_r$ has a predetermined relationship to magnitude of current I. In some embodiments, replica transistor 340 is co-packaged with power transistor 204, and in particular embodiments, replica transistor 340 and power transistor 204 are formed in a common piece of semiconductor material.

Figure 4:
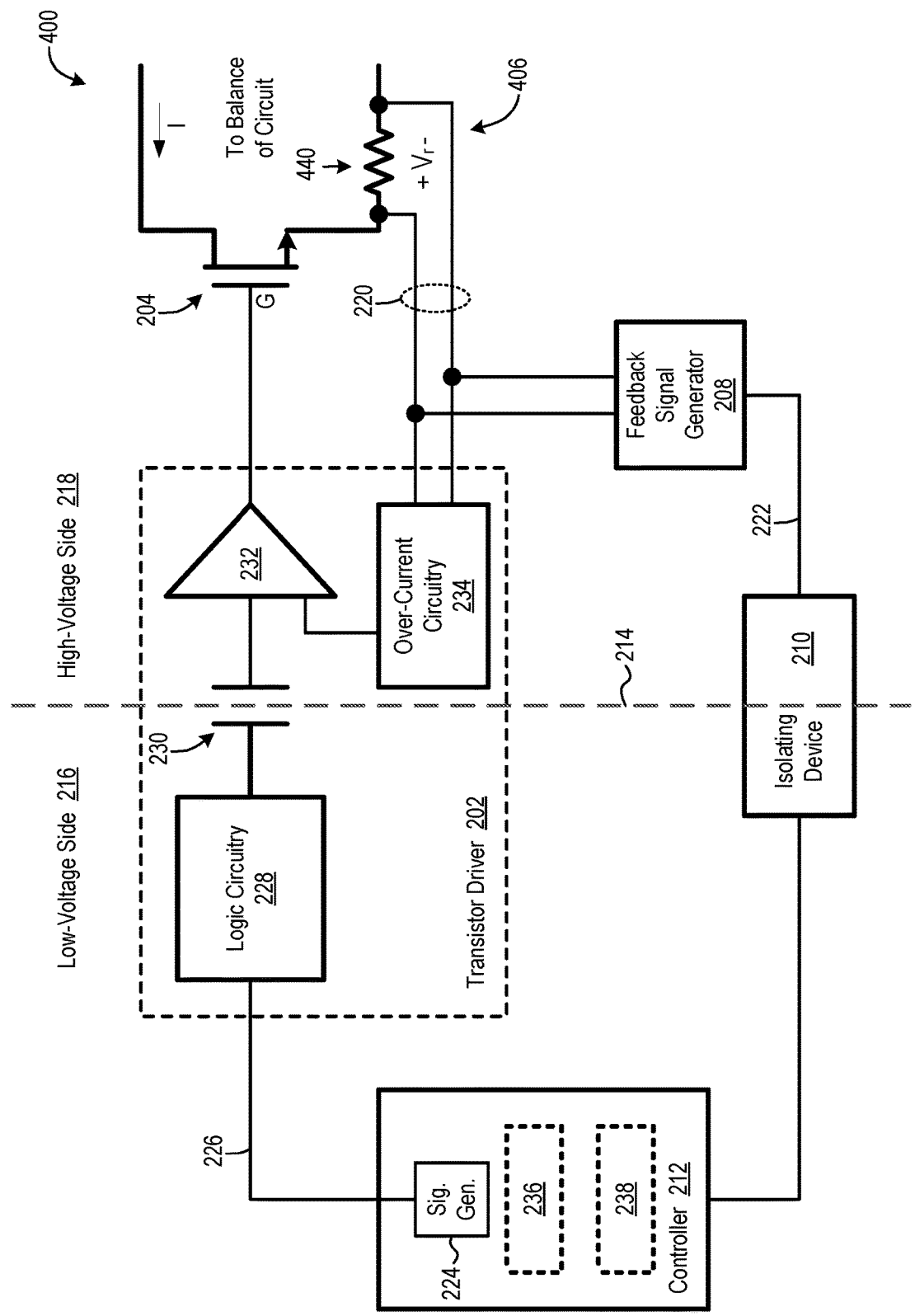
FIG. 4 illustrates an embodiment of the FIG. 2 switching circuit where a current sense device includes a current sense resistor.

FIG. 4 illustrates a switching circuit 400, which is an embodiment of switching circuit 200 where current sense device 206 is embodied as a current sense device 406. Current sense device 406 includes a current sense resistor 440 electrically coupled to power transistor 204 such that a voltage $V_r$ across current sense resistor 440 is proportional to magnitude of current I. Voltage $V_r$ is communicatively coupled to over-current circuitry 234 and feedback signal generator 208 as current signal 220.

Figure 5:
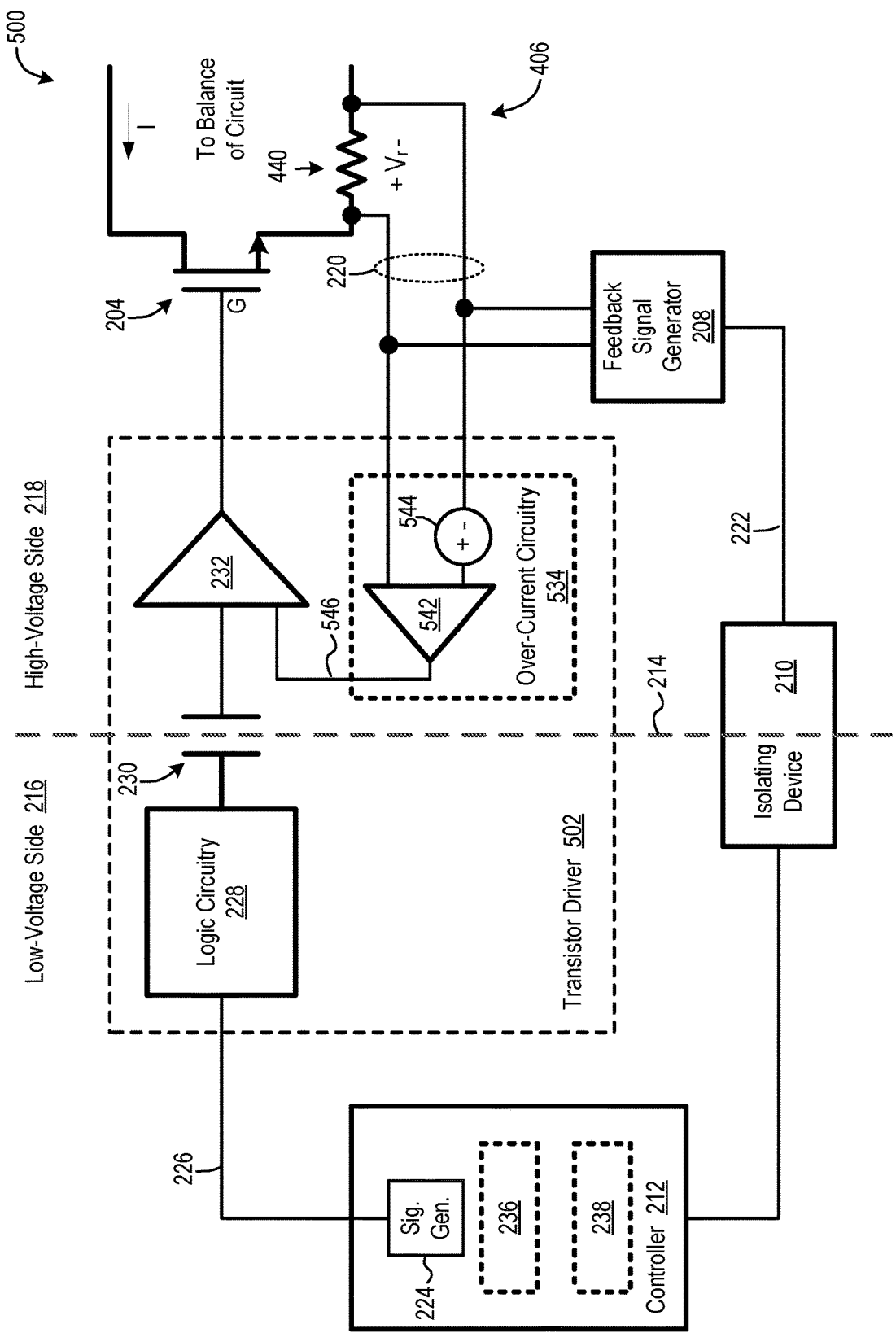
FIG. 5 illustrates another embodiment of the FIG. 2 switching circuit where a current sense device includes a current sense resistor.

FIG. 5 illustrates a switching circuit 500, which is another embodiment of switching circuit 200 including current sense device 406. Transistor driver 202 is embodied as transistor driver 502 in switching circuit 500. Transistor driver 502 includes over-current circuitry 534, which is an embodiment of over-current circuitry 234. Over-current circuitry 534 includes a comparator 542 and a reference voltage source 544. Comparator 542 is configured to compare voltage $V_r$, which represents magnitude of current I, to a reference value set by reference voltage source 544. Comparator 542 asserts a shut-down signal 546 in response to voltage $V_r$ exceeding the reference value, to detect the over-current condition. Driver circuitry 232 shuts-down power transistor 204 in response to assertion of shut-down signal 546.

Figure 6:
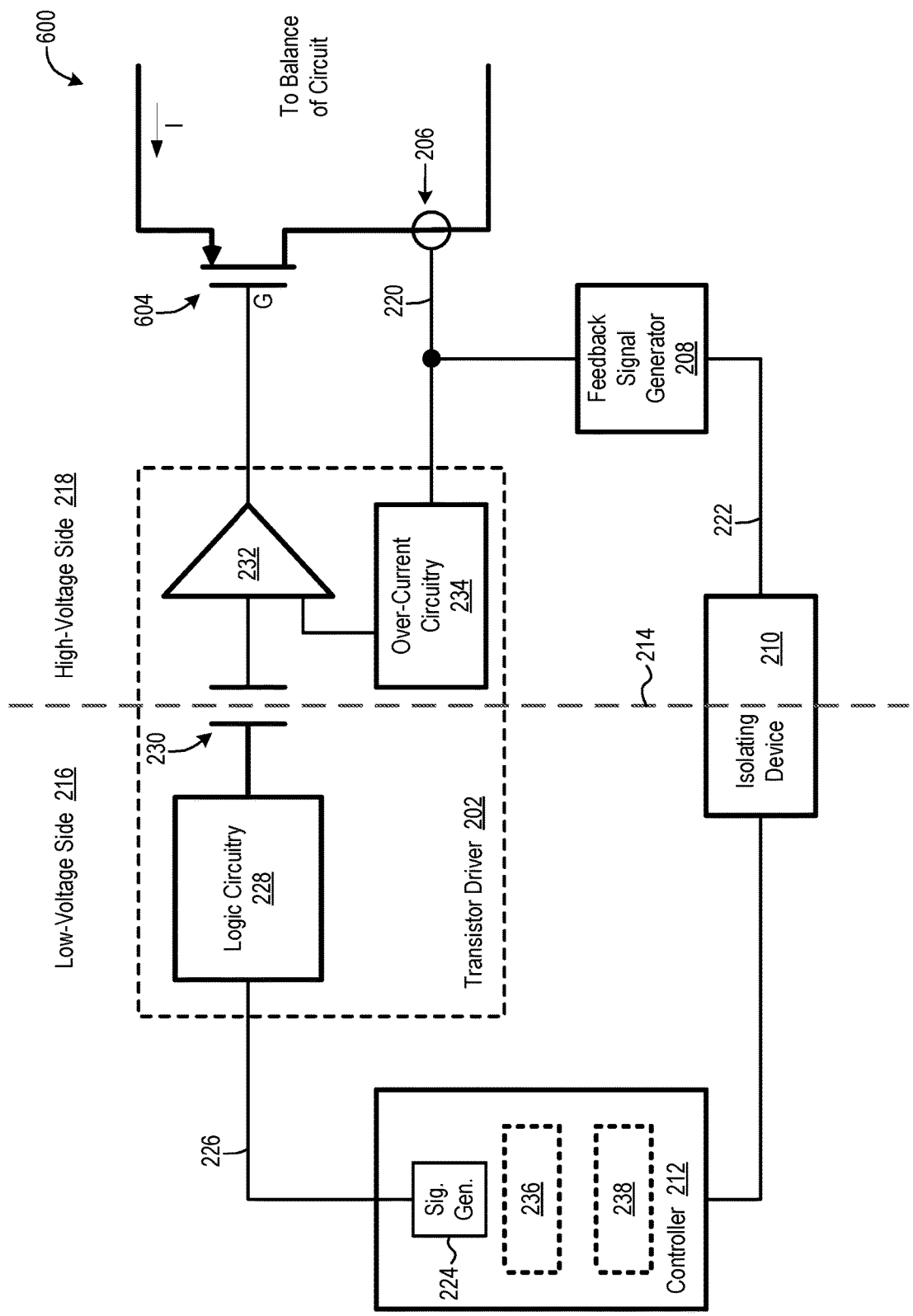
FIG. 6 illustrates an embodiment of the FIG. 2 switching circuit including a p-channel power transistor.

Although power transistor 204 is depicted as an n-channel metal oxide semiconductor field effect transistor (MOSFET), power transistor 204 could be replaced with another type of transistor, including but not limited to a p-channel MOSFET, a bipolar junction transistor (BJT), or an IGBT, with appropriate modifications to driver circuitry 232. For example, FIG. 6 illustrates a switching circuit 600 including a power transistor in the form of a p-channel MOSFET 604 instead of an n-channel MOSFET. Driver circuitry 232 drives a gate G of power transistor 604 according to control signal 226 to cause power transistor 604 to switch in a manner similar to that discussed above with respect to FIG. 2. For instance, in some embodiments, driver circuitry 232 drives gate G between at least two different voltage magnitudes according to control signal 226, to cause power transistor 604 to switch between its on and off states according to control signal 226.

Figure 7:
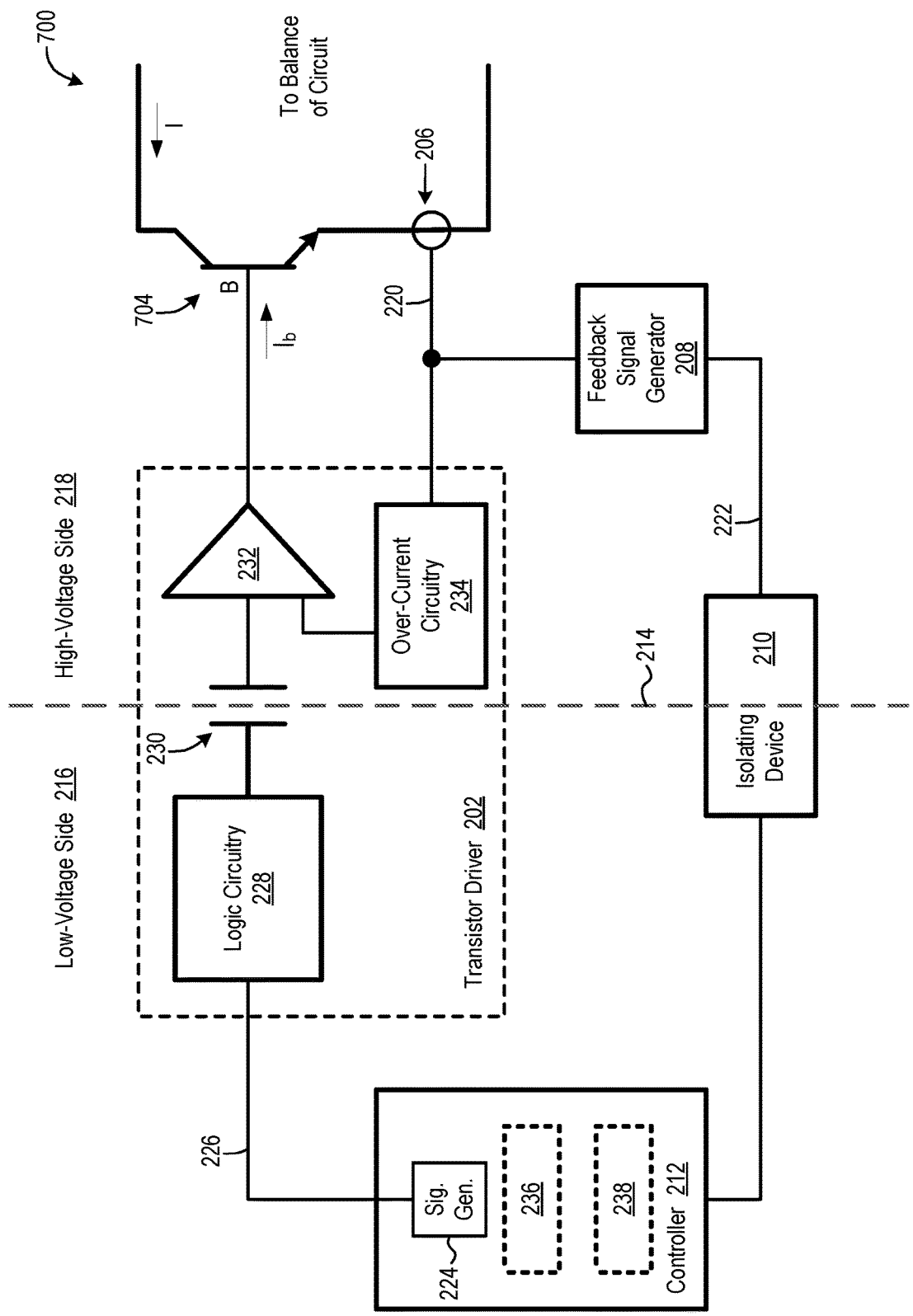
FIG. 7 illustrates an embodiment of the FIG. 2 switching circuit including a bipolar junction power transistor.

FIG. 7 illustrates another example of power transistor 204 being replaced with a different type of transistor. In particular, FIG. 7 illustrates a switching circuit 700 including a power transistor in the form of a BJT 704 instead of an n-channel MOSFET. Driver circuitry 232 drives a base B of power transistor 704 according to control signal 226 to cause power transistor 704 to switch in a manner similar to that discussed above with respect to FIG. 2. For instance, in some embodiments, driver circuitry 232 drives base B between at least two different current $I_b$ magnitudes according to control signal 226, to cause power transistor 704 to switch between its on and off states according to control signal 226.

Figure 8:
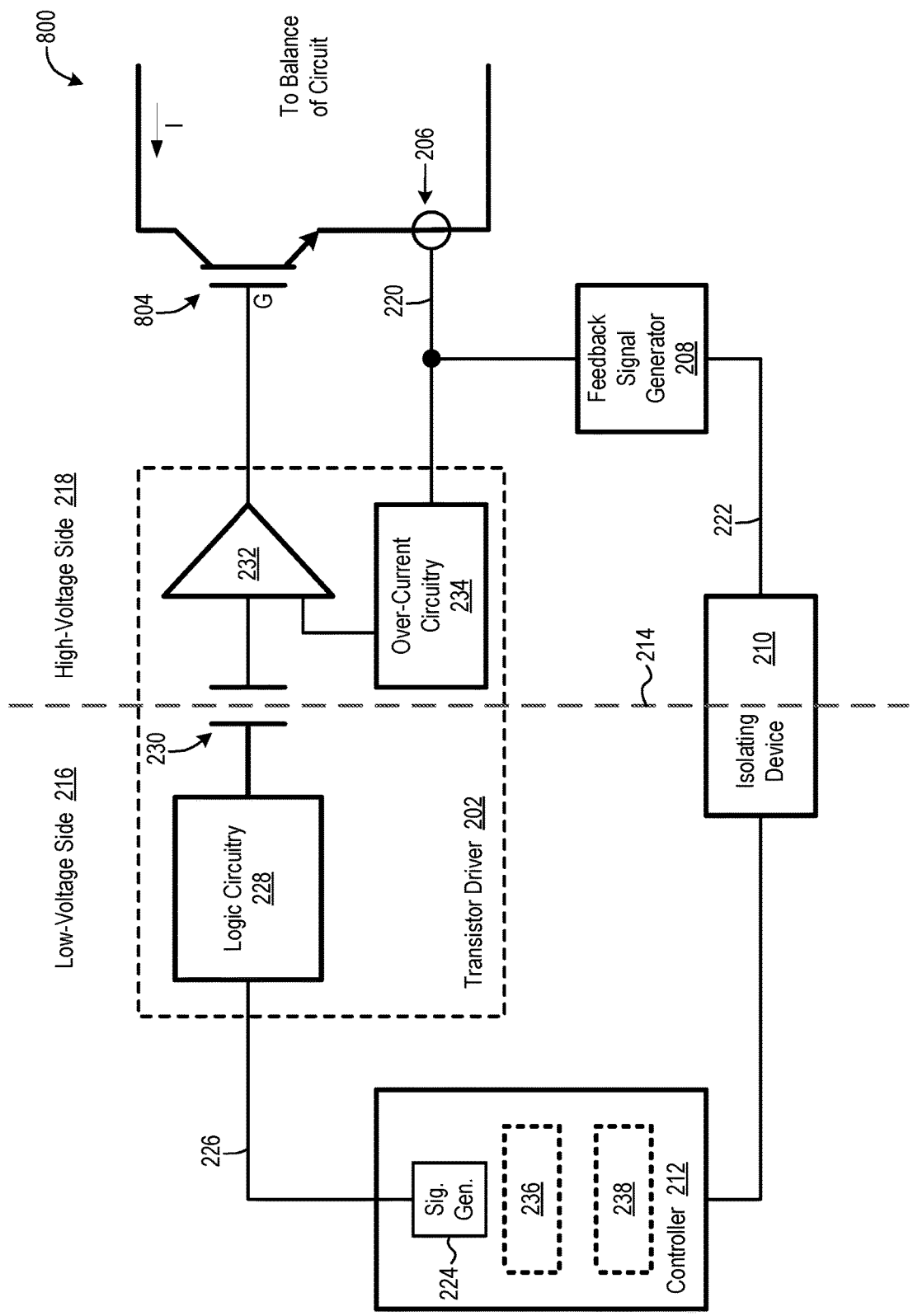
FIG. 8 illustrates an embodiment of the FIG. 2 switching circuit including an insulated gate bipolar junction power transistor.

FIG. 8 illustrates a switching circuit 800, which is yet another example of power transistor 204 being replaced with a different type of transistor. Switching circuit 800 includes a power transistor in the form of an IGBT 804 instead of an n-channel MOSFET. Driver circuitry 232 drives a gate G of power transistor 804 according to control signal 226 to cause power transistor 804 to switch in a manner similar to that discussed above with respect to FIG. 2. For instance, in some embodiments, driver circuitry 232 drives gate G between at least two different voltage magnitudes according to control signal 226, to cause power transistor 804 to switch between its on and off states according to control signal 226.

Figure 9:
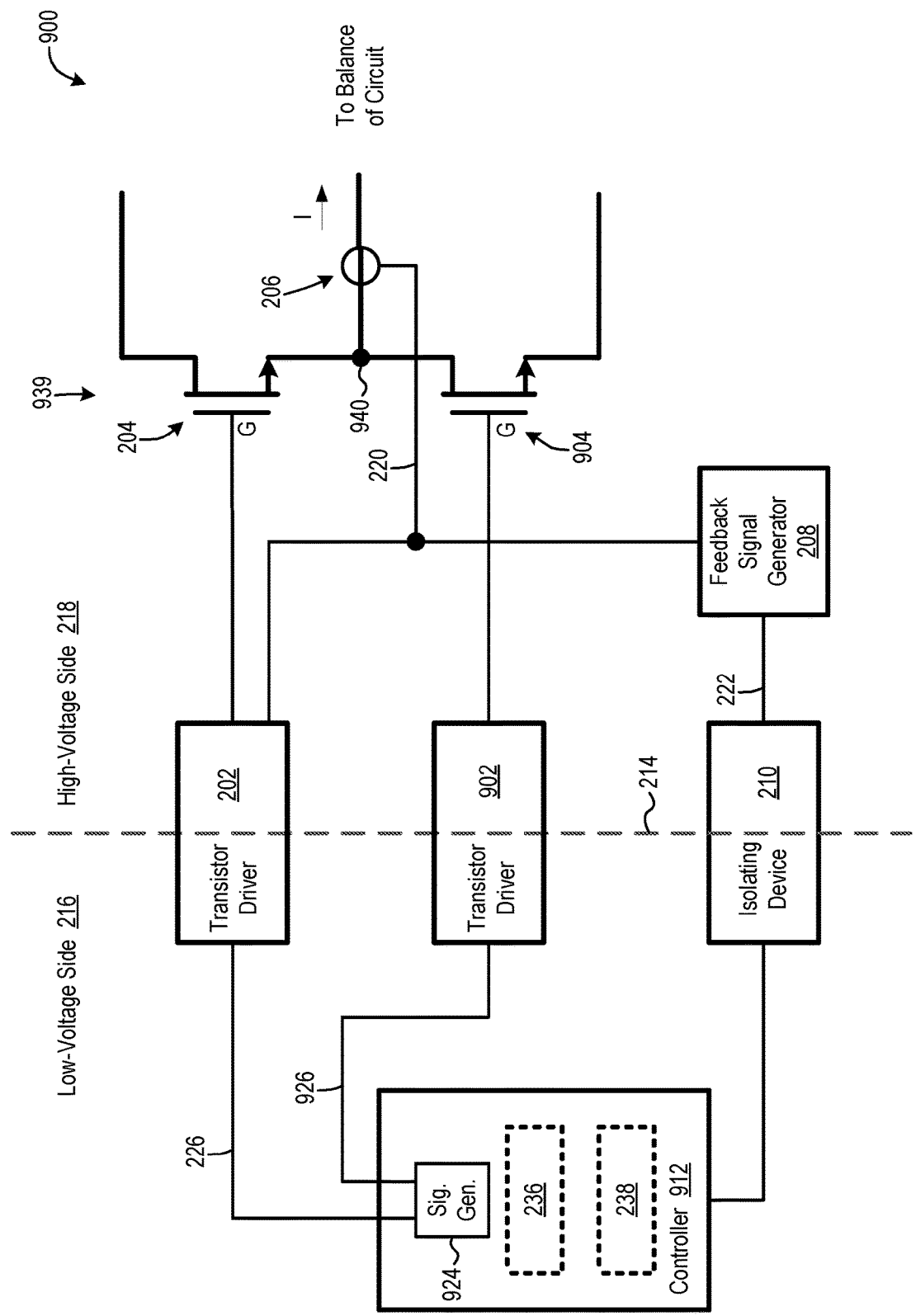
FIG. 9 illustrates another switching circuit including an instance of a transistor driver of FIG. 2, according to an embodiment.

The transistor drivers disclosed herein are not limited to use in the switching circuits discussed above. For example, FIG. 9 illustrates a switching circuit 900 including an instance of transistor driver 202. Switching circuit 900 is similar to switching circuit 200, but switching circuit 900 further includes an additional power transistor 904 and an additional transistor driver 902. Details of transistor driver 202 are not shown in FIG. 9 to promote illustrative clarity. Power transistor 204 and power transistor 904 are electrically coupled to together to form a switching leg 939 having a midpoint node 940, and current sense device 206 is electrically coupled to midpoint node 940. Switching circuit 900 additionally includes controller 912 in place of controller 212, where controller 912 is like controller 212 but includes a signal generator 924. Signal generator 924 generates a second control signal 926 in addition to first control signal 226. Second control signal 926 is communicatively coupled to transistor driver 902 which drives power transistor 904 according to second control signal 926. Transistor driver 902 is similar to transistor driver 202, but transistor driver 902 does not include over-current circuitry 234.

Signal generator 924 is configured to assert first and second control signals 226 and 926 in a complementary manner, such that power transistors 204 and 904 switch in a complementary manner. Consequently, power transistor 904 is off when power transistor 204 is on, and power transistor 904 is on when power transistor 202 is off. Current signal 220 generated by current sense device 206 represents current flowing through power transistor 204 when power transistor 204 is on, and current signal 220 represents current flowing through power transistor 904 when power transistor 904 is on. Switching circuit 900 otherwise operates in a manner similar to that of switching circuit 200.

Switching circuit 900 can be modified to include additional power transistors and associated transistor drivers without departing from the scope hereof. For example, one alternate embodiment (not shown) of switching circuit 900 includes six power transistors collectively forming three legs, where each leg is configured similarly to leg 939 of FIG. 9. Controller 912 in this alternate embodiment is configured to drive each leg 120 degrees out-of-phase with respect to each other leg, such as to implement a three-phase switching circuit.

Figure 10:
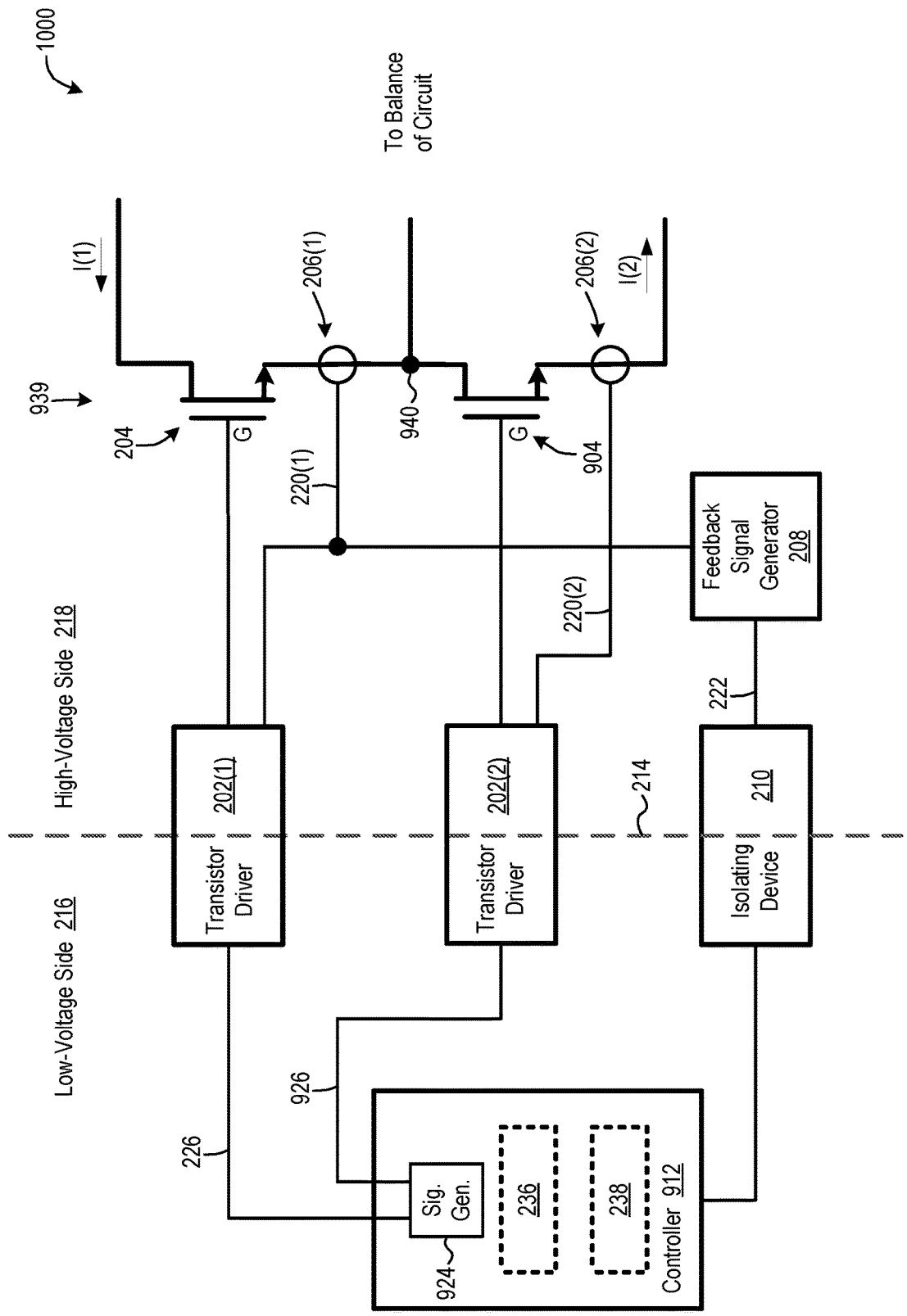
FIG. 10 illustrates yet another switching circuit including an instance of the FIG. 2 transistor driver, according to an embodiment.

FIG. 10 illustrates a switching circuit 1000, which is similar to switching circuit 900 but includes (a) a second instance of transistor driver 202 in place of transistor driver 902 and (b) a second instance of current sense circuitry 206. The two instances of transistor driver 202 are referred to as transistor driver 202(1) and 202(2), respectively, and the two instances of current sense device 206 are referred to as current sense device 206(1) and 206(2), respectively. Current sense device 206(1) is electrically coupled in series with power transistor 204 and generates a current signal 220(1) representing magnitude of current I(1) flowing through power transistor 204. Similarly, current sense device 206(2) is electrically coupled in series with power transistor 904 and generates a current signal 220(2) representing magnitude of current I(2) flowing through power transistor 904.

Current signal 220(1) is communicatively coupled to over-current circuitry (not shown) of transistor driver 202(1) to enable transistor driver 202(1) to shut-down power transistor 204 in response to an over-current event associated with power transistor 204. Additionally, current signal 220(1) is communicatively coupled to feedback signal generator 208 such that feedback signal 222 is associated with current I(1). Current signal 220(2) is communicatively coupled to over-current circuitry (not shown) of transistor driver 202(2) to enable transistor driver 202(2) to shut-down power transistor 904 in response to an over-current event associated with power transistor 904. Transistor drivers 202(1) and 202(2) drive power transistors 204 and 904 according to control signals 226 and 926, respectively. Switching circuit 1000 otherwise operates in a manner similar to that of switching circuit 900.

Figure 11:
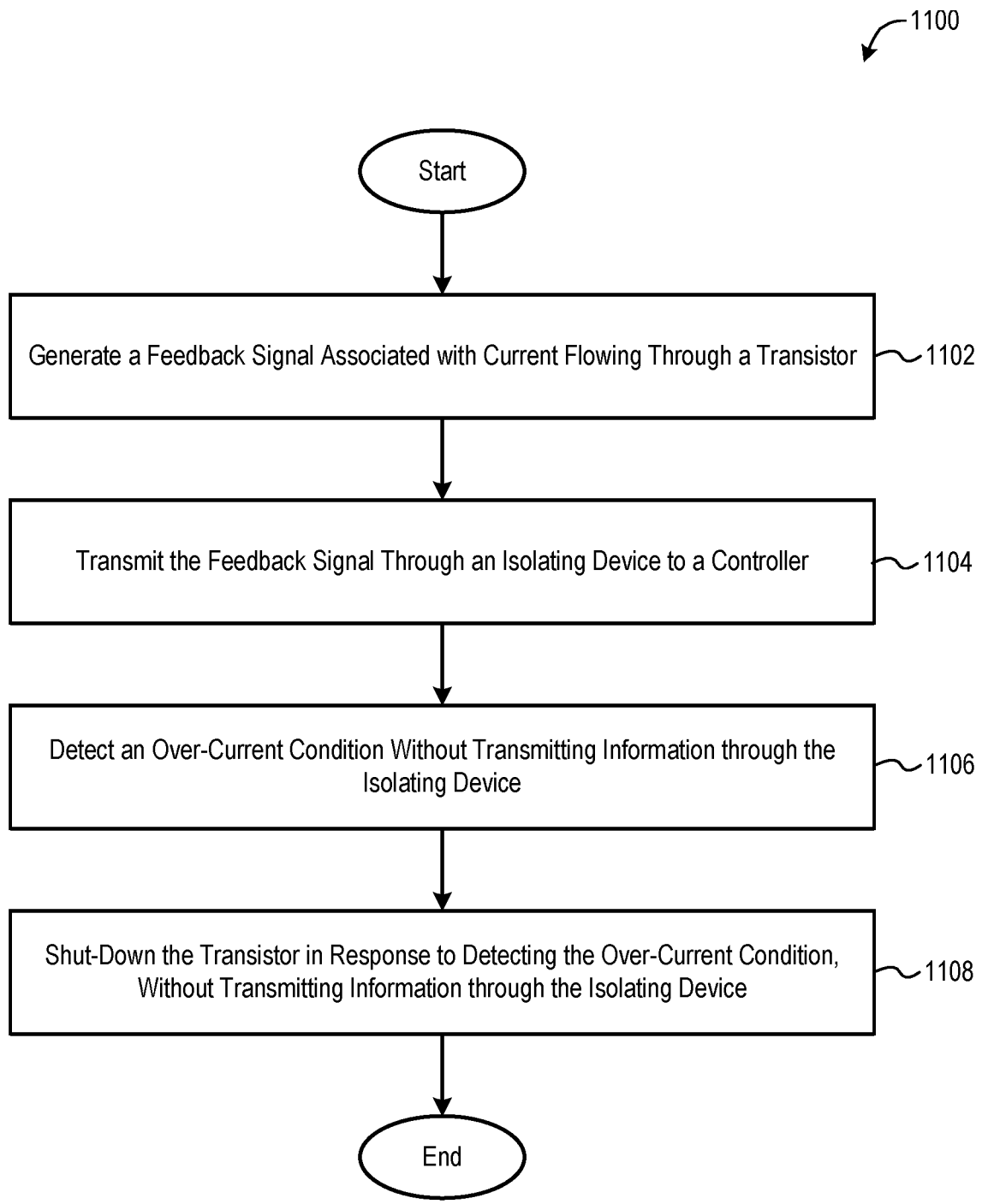
FIG. 11 illustrates a method for quickly shutting down a transistor in a switching circuit, according to an embodiment.

FIG. 11 illustrates a method 1100 for quickly shutting down a transistor in a switching circuit. In step 1102, a feedback signal associated with current flowing through the transistor is generated. In one example of step 1102, feedback signal generator 208 generates feedback signal 222 based on current signal 220. In step 1104, the feedback signal is transmitted through an isolating device to a controller. In one example of step 1104, feedback signal 222 is transmitted through isolating device 210, e.g., across galvanic isolation boundary 214, to controller 212. In step 1106, an over-current condition is detected in the switching circuit without transmitting information through the isolating device. In one example of step 1106, over-current circuitry 234 detects occurrence of an over-current condition in response to magnitude of current I through power transistor 204 exceeding a threshold value, without over-current circuitry 234 transmitting information through isolating devices 210 and 230 and without transferring information across galvanic isolation boundary 214. In step 1108, the transistor is shut-down in response to detecting the over-current condition, without transmitting information through the isolating device. In one example of step 1108, driver circuitry 232 shuts-down power transistor 204 in response to over-current circuitry 234 detecting an over-current condition, without transmitting information through isolating devices 210 and 230 and without transmitting information across galvanic isolation boundary 214.

Combinations of Features

Features described above may be combined in various ways without departing from the scope hereof. The following examples illustrate some possible combinations:

(A1) A method for quickly shutting down a transistor in a switching circuit may include (1) generating a feedback signal associated with current flowing through the transistor, (2) transmitting the feedback signal through a first isolating device to a controller, (3) detecting an over-current condition in the switching circuit without transmitting information through the first isolating device, and (4) shutting-down the transistor in response to detecting the over-current condition, without transmitting information through the first isolating device.

(A2) In the method denoted as (A1), each of the steps of detecting the over-current condition and shutting-down the transistor may be performed using circuitry disposed on a high-voltage side of a galvanic isolation boundary of the switching circuit.

(A3) In the method denoted as (A2), the step of generating the feedback signal may be at least partially performed using circuitry disposed on the high-voltage side of the galvanic isolation boundary.

(A4) Any one of the methods denoted as (A2) and (A3) may further include (1) generating, on a low-voltage side of the galvanic isolation boundary, a control signal for controlling the transistor, (2) transmitting the control signal from the low-voltage side of the galvanic isolation boundary to the high-voltage side of the galvanic isolation boundary via a second isolating device, and (3) controlling switching of the transistor based at least partially based on the control signal.

(A5) The method denoted as (A4) may further include performing the step of shutting-down the transistor in response to detecting the over-current condition without transmitting information through the second isolating device.

(A6) In any one of the methods denoted as (A4) and (A5), the control signal may be one of a pulse width modulated (PWM) control signal and a pulse frequency modulated (PFM) control signal.

(A7) In any one of the methods denoted as (A1) through (A6), the step of detecting the over-current condition may include detecting magnitude of current flowing through the transistor exceeding a threshold value.

(A8) In any one of the methods denoted as (A1) through (A7), the feedback signal may represent at least magnitude of the current flowing through the transistor.

(A9) In any one of the methods denoted as (A1) through (A7), the feedback signal may represent at least occurrence of the over-current condition.

(B1) A transistor driver with fast shut-down capability may include (1) logic circuitry, (2) an isolating device, (3) driver circuitry configured to drive a transistor according to a control signal received from the logic circuitry via the isolating device, and (4) over-current circuitry configured to (a) detect an over-current condition without receiving information via the isolating device and (b) cause the driver circuitry to shut-down the transistor in response to detection of the over-current condition, without receiving information via the isolating device.

(B2) In the transistor driver denoted as (B1), the over-current circuitry may include a comparator configured to compare a signal representing magnitude of current through the transistor to a reference value, to detect the over-current condition.

(B3) In any one of the transistor drivers denoted as (B1) and (B2), the isolating device may include a capacitive isolating device.

(C1) A switching circuit may include (1) a power transistor, (2) a current sense device electrically coupled to the power transistor, (3) a feedback signal generator configured to generate a feedback signal associated with current flowing through the power transistor, (4) a controller, (5) an isolating device configured to communicatively couple the feedback signal to the controller, and (6) a transistor driver, communicatively coupled to the power transistor, the current sense device, and the controller. The transistor driver may be configured to (1) drive the power transistor according to a control signal generated by the controller, (2) detect an over-current condition in the switching circuit from a current signal generated by the current sense device, without transmitting information through the isolating device, and (3) shut-down the power transistor in response to detection of the overcurrent condition, without transmitting information through the isolating device.

(C2) In the switching circuit denoted as (C1), the feedback signal generator may be configured to generate the feedback signal based on the current signal from the current sense device.

(C3) In any one of the switching circuits denoted as (C1) and (C2), the current sense device may include a current sense resistor.

(C4) In any one of the switching circuits denoted as (C1) and (C2), the current sense device may include a replica transistor electrically coupled to the power transistor.

(C5) In any one of the switching circuits denoted as (C1) and (C2), the feedback signal generator may be configured to generate the feedback signal in a digital form.

(C6) In any one of the switching circuits denoted as (C1) through (C5), the transistor driver may include (1) logic circuitry disposed on a low-voltage side of a galvanic isolation boundary of the switching circuit and communicatively coupled to the controller, (2) driver circuitry disposed on a high-voltage side of the galvanic isolation boundary and configured to drive the transistor according to the control signal, and (3) over-current circuitry disposed on the high-voltage side of the galvanic isolation boundary and configured to (a) detect the overcurrent condition and (b) shut-down the power transistor in response to detection of the overcurrent condition.

(C7) In the switching circuit denoted as (C6), the over-current circuitry may include a comparator configured to compare a signal representing magnitude of current through the power transistor to a reference value, to detect the over-current condition.

(C8) In any one of the switching circuits denoted as (C1) through (C7), the controller may include at least one of a motor drive controller and an inverter controller.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method for quickly shutting down a transistor in a switching circuit, comprising:
    generating a feedback signal associated with current flowing through the transistor;
    transmitting the feedback signal through a first isolating device to a controller;
    detecting an over-current condition through the transistor without transmitting information through the first isolating device; and
    shutting-down the transistor in response to detecting the over-current condition, without transmitting information through the first isolating device.

2. The method of claim 1, wherein each of the steps of detecting the over-current condition and shutting-down the transistor are performed using circuitry disposed on a high-voltage side of a galvanic isolation boundary of the switching circuit.

3. The method of claim 2, wherein the step of generating the feedback signal is at least partially performed using circuitry disposed on the high-voltage side of the galvanic isolation boundary.

4. The method of claim 2, further comprising:
    generating, on a low-voltage side of the galvanic isolation boundary, a control signal for controlling the transistor;
    transmitting the control signal from the low-voltage side of the galvanic isolation boundary to the high-voltage side of the galvanic isolation boundary via a second isolating device; and
    controlling switching of the transistor based at least partially based on the control signal.

5. The method of claim 4, further comprising performing the step of shutting-down the transistor in response to detecting the over-current condition without transmitting information through the second isolating device.

6. The method of claim 4, wherein the control signal is one of a pulse width modulated (PWM) control signal and a pulse frequency modulated (PFM) control signal.

7. The method of claim 1, wherein the step of detecting the over-current condition comprises detecting magnitude of current flowing through the transistor exceeding a threshold value.

8. The method of claim 1, wherein the feedback signal represents at least magnitude of the current flowing through the transistor.

9. The method of claim 1, wherein the feedback signal represents at least occurrence of the over-current condition.

10. A transistor driver with fast shut-down capability, comprising:
    logic circuitry;
    an isolating device;
    driver circuitry configured to drive a transistor according to a control signal received from the logic circuitry via the isolating device; and
    over-current circuitry configured to:
        detect an over-current condition through the transistor without receiving information via the isolating device, and cause the driver circuitry to shut-down the transistor in response to detection of the over-current condition, without receiving information via the isolating device.

11. The transistor driver of claim 10, wherein the over-current circuitry comprises a comparator configured to compare a signal representing magnitude of current through the transistor to a reference value, to detect the over-current condition.

12. The transistor driver of claim 10, wherein the isolating device comprises a capacitive isolating device.

13. A switching circuit, comprising:
a power transistor;
a current sense device electrically coupled to the power transistor;
a feedback signal generator configured to generate a feedback signal associated with current flowing through the power transistor;
a controller;
an isolating device configured to communicatively couple the feedback signal to the controller; and
a transistor driver, communicatively coupled to the power transistor, the current sense device, and the controller, wherein the transistor driver is configured to:
drive the power transistor according to a control signal generated by the controller,
detect an over-current condition in the switching circuit from a current signal generated by the current sense device, without transmitting information through the isolating device, and
shut-down the power transistor in response to detection of the overcurrent condition, without transmitting information through the isolating device.

14. The switching circuit of claim 13, wherein the feedback signal generator is configured to generate the feedback signal based on the current signal from the current sense device.

15. The switching circuit of claim 14, wherein the current sense device comprises a current sense resistor.

16. The switching circuit of claim 14, wherein the current sense device comprises a replica transistor electrically coupled to the power transistor.

17. The switching circuit of claim 14, wherein the feedback signal generator is configured to generate the feedback signal in a digital form.

18. The switching circuit of claim 14, wherein the transistor driver comprises:
logic circuitry disposed on a low-voltage side of a galvanic isolation boundary of the switching circuit and communicatively coupled to the controller;
driver circuitry disposed on a high-voltage side of the galvanic isolation boundary and configured to drive the transistor according to the control signal; and
over-current circuitry disposed on the high-voltage side of the galvanic isolation boundary and configured to:
detect the overcurrent condition, and
shut-down the power transistor in response to detection of the overcurrent condition.

19. The switching circuit of claim 18, wherein the over-current circuitry comprises a comparator configured to compare a signal representing magnitude of current through the power transistor to a reference value, to detect the over-current condition.

20. The switching circuit of claim 13, wherein the controller comprises at least one of a motor drive controller and an inverter controller.

* * * * *